US012793942B2

(12) United States Patent
Thome et al.

(10) Patent No.: US 12,793,942 B2
(45) Date of Patent: Nov. 10, 2026

(54) METHOD FOR IGNITING AND SUPPLYING A LASER OR PLASMA WITH POWER, AND PLASMA OR LASER SYSTEM

(71) Applicant: TRUMPF Hüttinger GmbH + Co. KG, Freiburg (DE)

(72) Inventors: Christian Thome, Freiburg (DE); Ekkehard Mann, Gundelfingen (DE); Helmut Strycek, Reute (DE)

(73) Assignee: TRUMPF HÜTTINGER GMBH + CO. KG, Freiburg (DE)

( * ) Notice: Subject to any disclaimer, the term of this patent is extended or adjusted under 35 U.S.C. 154(b) by 32 days.

(21) Appl. No.: 19/038,728

(22) Filed: Jan. 28, 2025

(65) Prior Publication Data

US 2025/0174438 A1 May 29, 2025

Related U.S. Application Data

(63) Continuation of application No. PCT/EP2023/070709, filed on Jul. 26, 2023.

(30) Foreign Application Priority Data

Jul. 29, 2022 (DE) .................... 10 2022 119 156.7

(51) Int. Cl.
*H01J 37/32* (2006.01)
*H01S 3/097* (2006.01)

(52) U.S. Cl.
CPC .... *H01J 37/32183* (2013.01); *H01S 3/09702* (2013.01); *H01J 2237/332* (2013.01); *H01J 2237/334* (2013.01)

(58) Field of Classification Search
CPC ........... H01J 37/32174; H01J 37/32183; H01J 2237/332; H01J 2237/334; H01S 3/07902
See application file for complete search history.

(56) References Cited

U.S. PATENT DOCUMENTS

2005/0255809 A1 11/2005 Glueck
2007/0145900 A1 6/2007 Kirchmeier et al.
(Continued)

FOREIGN PATENT DOCUMENTS

DE 102007046047 A1 4/2008
DE 102009030694 A1 12/2009
(Continued)

OTHER PUBLICATIONS

Machine Translation KR102143178B1 (Year: 2020).*
(Continued)

*Primary Examiner* — Raymond R Chai
(74) *Attorney, Agent, or Firm* — LEYDIG, VOIT & MAYER, LTD.

(57) ABSTRACT

A method for igniting and supplying a laser or a processing plasma in a discharge chamber with electrical power includes providing a power from an output terminal of an amplifier to the discharge chamber. The amplifier includes two amplifier paths, each of which supplies a respective signal to a combiner. The combiner is configured to combine the signals as a function of an amplitude relationship and/or a phase relationship between the signals and to supply the power to the output terminal and/or an isolation terminal. The method further includes actuating an impedance switching arrangement connected to the isolation terminal and a ground according to a first actuation mode in order to ignite the laser or the processing plasma, and actuating the impedance switching arrangement according to a second actuation mode in order to operate the laser or maintain the processing plasma in the discharge chamber.

11 Claims, 4 Drawing Sheets

(56) References Cited

U.S. PATENT DOCUMENTS

| | | | | |
|---|---|---|---|---|
| 2008/0074735 | A1 | 3/2008 | Bakalski et al. | |
| 2009/0322421 | A1 | 12/2009 | Mueller et al. | |
| 2014/0218104 | A1 | 8/2014 | Kunihiro | |
| 2015/0214909 | A1 | 7/2015 | Kobayashi | |
| 2015/0270104 | A1* | 9/2015 | Van Zyl ............ | H01J 37/32146<br>315/111.21 |
| 2016/0172739 | A1 | 6/2016 | Srirattana et al. | |
| 2017/0213734 | A9* | 7/2017 | Marakhtanov ...... | C23C 16/5096 |
| 2021/0043995 | A1 | 2/2021 | Tokuda et al. | |

FOREIGN PATENT DOCUMENTS

| | | | | |
|---|---|---|---|---|
| DE | 202017103327 | U1 | 8/2017 | |
| DE | 102022108631 | A1 | 10/2023 | |
| EP | 1783904 | A1 | 5/2007 | |
| JP | 2017516258 | A | 6/2017 | |
| JP | 2017537555 | A | 12/2017 | |
| KR | 102143178 | B1 * | 8/2020 | ........ H01J 37/32174 |
| WO | WO 2013042754 | A1 | 3/2013 | |
| WO | WO 2015091468 | A1 | 6/2015 | |
| WO | WO-2018237113 | A1 * | 12/2018 | ........ H01J 37/32577 |
| WO | WO 2019208657 | A1 | 10/2019 | |
| WO | WO 2020025547 | A1 | 2/2020 | |

OTHER PUBLICATIONS

Alt, Alexander et al., Analysis of high power LDMOS amplifiers for industrial applications under mismatch conditions, IEEE Topical Conference on Power Amplifiers for Wireless and Radio Applications (PAWR), Jan. 2014, pp. 61-63, USA, DOI:10.1109/PAWR.2014.6825730.

* cited by examiner

METHOD FOR IGNITING AND SUPPLYING A LASER OR PLASMA WITH POWER, AND PLASMA OR LASER SYSTEM

CROSS REFERENCE TO RELATED APPLICATIONS

This application is a continuation of International Application No. PCT/EP2023/070709 (WO 2024/023157 A1), filed on Jul. 26, 2023, and claims benefit to German Patent Application No. DE 10 2022 119 156.7, filed on Jul. 29, 2022. The aforementioned applications are hereby incorporated by reference herein.

FIELD

Embodiments of the present invention relate to a method for igniting and supplying of a gas laser or a plasma in a discharge chamber with power. Embodiments of the invention also relate to a plasma or laser system, comprising a discharge chamber and an amplifier.

BACKGROUND

A plasma for processing workpieces, thus, for example, for etching or coating workpieces in an industrial plasma installation, is often excited using high-frequency energy. In order to ignite the plasma, it is known to apply the full operating power with an increased voltage to the plasma installation in order to achieve the fastest possible ignition of the plasma. So-called balanced amplifiers are often used in such systems. Such a balanced amplifier typically has two amplifier paths, which each supply a signal to a combiner, also called a coupler, wherein the combiner has an output terminal and an isolation terminal and is configured so that it combines the signals as a function of their amplitude and/or phase relationship and supplies power to the output terminal and/or the isolation terminal. The amplifier paths are typically operated for this purpose having a mutual phase shift of 90°. Such balanced amplifiers and their properties are also described, for example, in the following publication: Alexander Alt et al.: "Analysis of high power LDMOS amplifiers for industrial applications under mismatch conditions", published in 2014 IEEE Topical Conference on Power Amplifiers for Wireless and Radio Applications (PAWR), Electronic ISBN:978-1-4799-2778-4.

In suitable balanced amplifiers designed for the operation on a laser or plasma, the output power over the complex load plane is essentially flat, thus essentially constant. Power peaks (peaking) can be generated only with difficulty. It is possible to achieve pseudo-peaking only by choosing a higher DC supply voltage. A higher power for ignition can be generated by the temporarily higher DC supply voltage. However, generating a higher DC supply voltage for the power peak is very complex.

In unbalanced amplifiers, in particular those which do not have a coupler, an impedance for ignition, at which a power peak occurs, can be chosen by a suitable cable length between the amplifier and the plasma chamber or discharge chamber. Unbalanced amplifiers have numerous other disadvantages, because of which they are used more and more rarely in operation on plasmas or lasers.

One possibility for igniting such a plasma or laser system using a balanced amplifier is described, for example, in DE 102022108631.3, filed on 4 Aug. 2022 under the title: "Method for supplying a laser or plasma with power, and plasma or laser system". For ignition and operation, the phase relationship between the amplifier paths in the ignition operation is changed in relation to the phase relationship in the plasma processing or laser excitation operation. The method described therein functions very well in many systems, but not with satisfactory reliability in all systems.

SUMMARY

Embodiments of the present invention provide a method for igniting and supplying a laser or a processing plasma in a discharge chamber with electrical power. The method includes providing a power from an output terminal of an amplifier to the discharge chamber. The amplifier includes at least two amplifier paths. Each of the two amplifier paths supplies a respective signal to a combiner. The combiner includes the output terminal and an isolation terminal, and is configured to combine the signals of the two amplifier paths as a function of an amplitude relationship and/or a phase relationship between the signals and to supply the power to the output terminal and/or the isolation terminal. The method further includes actuating an impedance switching arrangement connected to the isolation terminal and a ground according to a first actuation mode in order to ignite the laser or the processing plasma, and actuating the impedance switching arrangement according to a second actuation mode in order to operate the laser or maintain the processing plasma in the discharge chamber.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
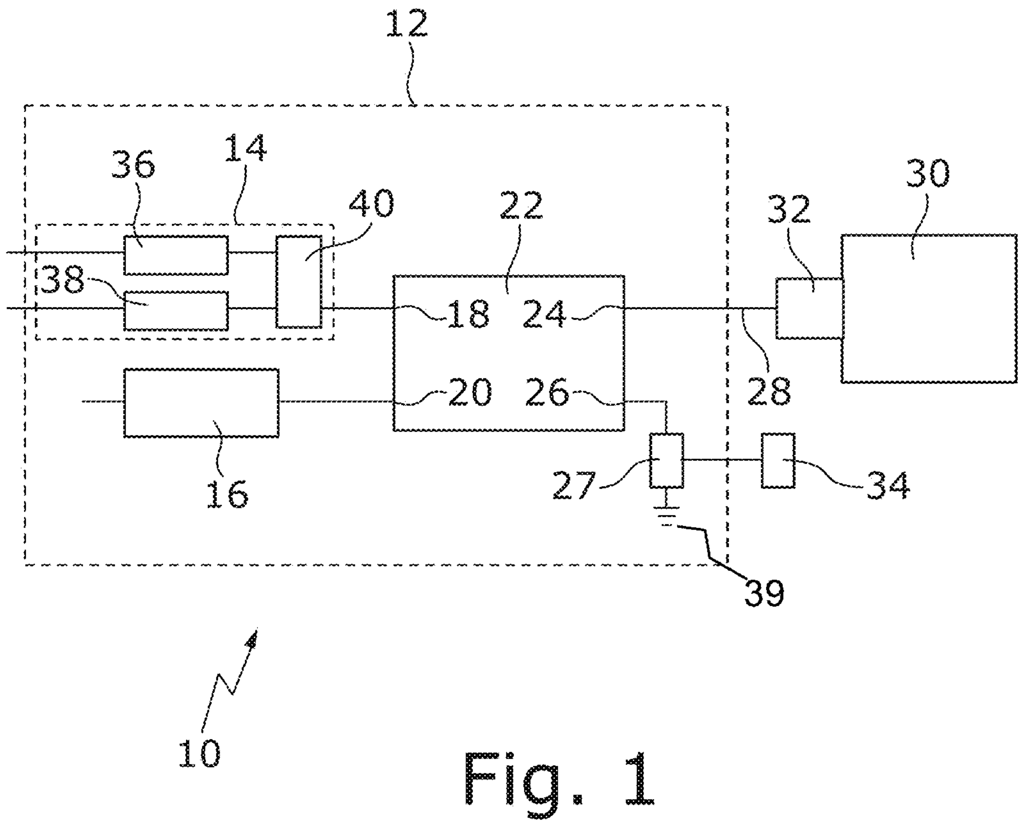
FIG. 1 shows a schematic illustration of a plasma system or a laser system.

Embodiments of the present invention provide a method and a device using which reliable ignition of a laser or plasma can be achieved.

According to embodiments of the invention, a method for improved igniting and supplying of a laser or a processing plasma in a discharge chamber with electrical power, wherein the method comprises the following steps:

a. providing power from an output terminal of an amplifier to the discharge chamber, wherein the amplifier comprises at least two amplifier paths, each of which supplies a signal to a combiner, wherein the combiner has an output terminal and an isolation terminal and is configured such that it combines the signals as a function of their amplitude and/or phase relationship and supplies power to the output terminal and/or the isolation terminal, b. activating an impedance switching arrangement connected to the isolation terminal and ground according to a first actuation mode in order to perform an ignition of the laser or processing plasma, c. activating the impedance switching arrangement connected to the isolation terminal according to a second actuation mode in order to operate a laser or maintain a processing plasma in the discharge chamber.

According to embodiments of the invention, the use of an impedance switching arrangement at the isolation terminal of the combiner is accordingly provided. This impedance switching arrangement replaces the conventional absorber resistor known from the prior art. The impedance switching arrangement can be designed such that in the second actuation mode, the impedance switching arrangement is designed and acts like a conventional absorber resistor. A conventional absorber resistor typically has the impedance of the coupler, which is typically 50 ohm. In specific designs, the resistance value can also be an integer divider or an integer multiple of 50 ohm, thus, for example, 25 ohm or 100 ohm. It can be ensured by activating the impedance switching arrangement that an overvoltage arises at the output terminal of the combiner and, connected thereto, a power peak, which is suitable for igniting a laser or processing plasma.

Ground means the electrical terminal of the reference potential of the amplifiers here, which is also called "ground" and is often abbreviated by "GND".

An impedance switching arrangement means an arrangement here which is capable of switching back and forth between various impedances. An impedance is intentionally not continuously changed in an analog manner here, but rather jumps are made between two or more values. A switching element can preferably be used for this purpose. Such a switching element can be, for example, a transistor, in particular an IGBT or MOSFET. However, electromechanical switching elements or PIN diodes are also conceivable. It is clear that such switching elements also have a transition time of the switching, thus cannot switch infinitely fast, but this time of the switching is also to be kept as short as possible in order to obtain reliable and rapid ignition. The switching element can be connected so that it short-circuits an impedance. Alternatively, the switching element can be connected so that it isolates an impedance. Two or more switching elements can also be provided. These can be connected so that an impedance is short-circuited and also an impedance is isolated.

With unignited laser or plasma multiple reflections sufficient for an ignition do not normally occur between the amplifier (its output terminal) and the unignited load, since most of the energy is absorbed in an impedance connected to the isolation terminal, the often so-called absorber resistor. According to embodiments of the invention, this impedance is now switched over suitably for the first actuation mode, so that it absorbs no or only little energy. This can result in multiple reflections of the power between the amplifier and the unignited load. A sufficiently high power or voltage thus arises to ignite the plasma or the laser. It has been shown in particular that switching has advantages over a regulated or controlled continuous change of the impedance of the absorber resistor. Specifically, faster and more reliable ignition can thus take place.

According to the method according to embodiments of the invention, the ignition of the plasma or laser can take place rapidly and reliably. In particular, the method can be used if the phase relationship or amplitude relationship of the signals combined in the combiner is not adjustable. This can be the case if the signals to be combined themselves originate from a combiner, in particular a 3 dB coupler.

The signals to be coupled in the combiner can have frequencies in the range of 1 to 100 MHz. In addition, they can have powers in the range of 0.5 to 6 kW. The signals to be coupled in the combiner can have a phase offset of 90°.

The impedance switching arrangement can be actuated so that the impedance between the isolation terminal and ground is approximately 0 ohm. For this purpose, the impedance switching arrangement can have a switching element arranged in parallel to an absorber resistor, wherein the impedance switching arrangement is arranged between the isolation terminal and ground, and the absorber resistor is designed and acts like a conventional absorber resistor known from the prior art. By switching the switching element to conductive, the absorber resistor can be short-circuited, so that no energy is absorbed in the impedance switching arrangement, in particular an absorber resistor.

Alternatively, the impedance switching arrangement can be actuated so that the impedance between the isolation terminal and ground is approximately infinite. For this purpose, a switching element can be arranged in series with an absorber resistor between the isolation terminal and ground, wherein the absorber resistor can be designed and act like a conventional absorber resistor known from the prior art. By opening the switching element, the absorber resistor can be decoupled from the isolation terminal or ground, so that no energy is absorbed in the impedance switching arrangement, in particular an absorber resistor.

To ignite the laser or the processing plasma, the impedance switching arrangement can be actuated in the first actuation mode for a predetermined time, in particular in the range 0.1-10 000 μs, preferably in the range 1-1000 μs. The time can be predetermined here so that it is ensured that a sufficiently large power peak is generated at the output terminal of the combiner that ignition of the laser or processing plasma takes place reliably.

Alternatively or additionally, to ignite the laser or the processing plasma, the impedance switching arrangement can be actuated in the first actuation mode until an ignition of the laser or plasma is detected. The ignition of the plasma can be optically monitored, for example. However, signals such as current, voltage, and power can also be detected between the combiner and the discharge chamber and an ignition of the laser or plasma can be derived therefrom, for example, in that a reflection factor is ascertained from the detected signals.

A 3 dB coupler, in particular a 90° hybrid coupler, can be used as the combiner. Two input signals phase-shifted by 90° can be combined by a 3 dB coupler, such that the combined power is output at the output terminal and no power is emitted at the isolation terminal. In this case, the amplifier paths that generate the signals can be decoupled and cannot mutually influence one another. A 3 dB coupler can itself ideally be lossless. This means that the power of the two amplifier paths can be fed completely to the load (plasma or laser) connected to the output terminal.

A phase angle of 90° between the signals can be set in order to maintain the plasma or laser. In particular, in conjunction with a 3 dB coupler, a maximum power can thus be passed to the plasma or the laser.

Embodiments of the invention furthermore relate to a plasma or laser system, comprising:

a. a discharge chamber,
b. an amplifier connected to the discharge chamber and comprising a combiner and at least two amplifier paths, each of which supplies a signal to the combiner, wherein the combiner has an output terminal and an isolation terminal and is configured such that it combines the signals as a function of their amplitude and/or phase relationship and supplies power to the output terminal and/or the isolation terminal,
c. an impedance switching arrangement, which is connected between the isolation terminal and ground and comprises an impedance and at least one switching element,
d. a controller configured to actuate the impedance switching arrangement to ignite a laser or processing plasma in the discharge chamber.

Such a system thus makes it possible to ignite a plasma or a laser even when a balanced amplifier is used.

The switching element can be connected in series or in parallel to the impedance. It is preferred if the switching element is arranged in parallel to the impedance. It is also conceivable that one switching element is provided in series and one is provided in parallel to the impedance. Greater flexibility with respect to the adjustment of the impedance at the isolation terminal to ignite the plasma or laser thus results. The switching element can be designed as a MOSFET.

An impedance matching device can be arranged between the plasma chamber or discharge chamber and the balanced amplifier, wherein the impedance matching device is connected to the output terminal via a line having a specifically selected electrical length, which can depend on the wavelength and dielectric material and magnetic properties of the connection. This measure makes it possible to assist rapid ignition of the laser or plasma.

The combiner can be embodied as a 3 dB coupler, in particular a 90° hybrid coupler. Such a combiner can in particular operate with low losses and combine a plurality of input signals to form an output signal having a higher power than each individual input signal.

The amplifier can in particular supply signals at a frequency of 13.56 and/or 27 MHz. The amplifier paths can each have a class F inverter. The class F inverter can have LDMOS transistors.

Exemplary embodiments of the invention are described below with reference to the figures of the drawing. The various features can be realized individually by themselves or as a plurality in any desired combinations.

In particular, the above described method can be combined with the method as described in DE 102022108631.3. Both methods can be used simultaneously or each in succession in different sequences or also overlapping. DE 102022108631.3 is incorporated in its entirety by reference in this application for this purpose.

A plasma or laser system described here is also described, for example, in WO2015/091468A1, WO2020/025547A1, or DE 10 2016 110141A1. These three publications are incorporated in their entirety by reference in this application. The plasma or laser systems described in the citations are refined here by the impedance switching arrangement. The methods described here and the devices described here can also advantageously be used and/or incorporated in the methods and devices as described in the citations.

The component designated in this document with "combiner" can be designed, for example, like a phase-shifting coupler unit in WO2015/091468A1 or like the "phase shifting coupler" in WO2020/025547A1.

The isolation terminal of the combiner in this document generally means an output terminal of the combiner at which no power is supplied in normal operation without reflections. It is also called an equalization terminal in other publications. An absorber resistor is typically connected thereto, for example, as in the documents cited above. This absorber resistor is often also called an absorption resistor, equalization resistor, or termination resistor.

FIG. 1 shows a plasma or laser system 10. The plasma or laser system 10 comprises a balanced amplifier 12 in particular, which has a first amplifier path 14 and a second amplifier path 16. The output signals of the first and second amplifier paths 14, 16 are passed to the input terminals 18, 20 of a combiner 22. The first and second amplifier paths 14, 16 are thus connected to the input terminals 18, 20 of the combiner 22. The combiner 22 has an output terminal 24 and an isolation terminal 26, to which an impedance switching arrangement 27 is connected. The impedance switching arrangement 27 is connected between the isolation terminal 26 and ground 39.

A discharge chamber 30 is connected to the output terminal 24 via a line 28. An impedance matching device 32 is arranged directly at the discharge chamber 30. In the exemplary embodiment shown, the discharge chamber 30 is thus connected to the amplifier 12 via the line 28 and the impedance matching device 32.

The combiner 22 is configured so that the signals arriving at the inputs 18, 20 are coupled to one another as a function of their phase relationship and/or amplitude relationship and passed to the output terminal 24 and/or the isolation terminal 26. The input signals of the combiner have a phase relationship and/or amplitude relationship which has the result that the signals are coupled by the combiner 22 so that a maximum power is output at the output terminal 24 and ideally no power is output at the isolation terminal 26.

The impedance switching arrangement 27 is actuated by a controller 34. In particular, one or more switching elements of the impedance switching arrangement 27 are thus actuated. Different configurations of the impedance switching arrangement 27 will be described.

It is conceivable that still further amplifier paths 14, 16 are present, which are connected to the combiner 22. In the exemplary embodiment shown, the amplifier path 14 itself again has amplifier paths 36, 38, the output signals of which are combined by the combiner 40. The output signal of the combiner 40 corresponds to the output signal of the amplifier path 14.

Each of the amplifier paths 16, 36, 38 can in turn be set up analogously to the amplifier path 14. It is also possible for only some amplifier paths to be set up like the amplifier path 14.

The input signals of the amplifier paths 14, 16 can originate from a splitter. The splitter can be set up analogously to the combiner 22.

Figure 2:
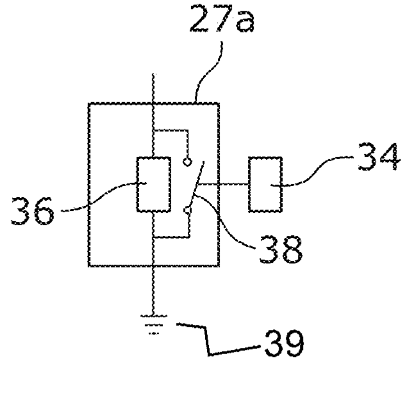
FIG. 2 shows a first embodiment of an impedance switching arrangement.

A first embodiment of the impedance switching arrangement 27 is identified in FIG. 2 with the number 27*a*. The impedance switching arrangement 27*a* has an impedance 36 in the form of an absorber resistor, to which a switching element 38 is connected in parallel. The switching element 38 is actuated by the controller 34.

When the switching element 38 is actuated by the controller 34 in a first actuation mode so that the switching element 38 is conductive, the impedance 36, in the form of an absorber resistor, is short-circuited, with the result that no energy can be absorbed at the isolation terminal 26. When no laser or plasma is ignited yet in the discharge chamber 30, power is reflected at the discharge chamber 30. This power now cannot be absorbed in the impedance 36, so that power reflection also occurs at the combiner 22. A power peak thus results at the output 24, which results in the ignition of the laser or the plasma in the discharge chamber 30.

After a predetermined time or when the ignition of the laser or plasma is detected, the switching element 38 can be opened in a second actuation mode and the ignited laser or the ignited plasma can be supplied with power in normal operation. If an impedance change of the plasma and a mismatch connected thereto should occur due to the dynamics of the plasma, the power reflected at the discharge chamber 30 can be absorbed in the impedance 36 in the form of the absorber resistor.

Figure 3:
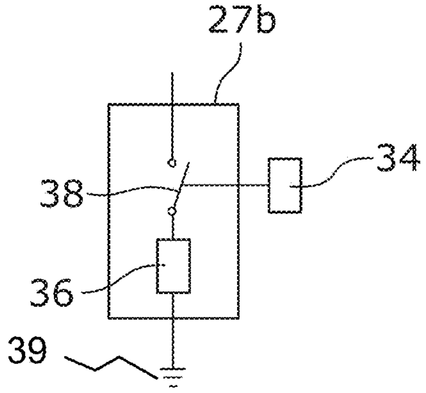
FIG. 3 shows a second embodiment of an impedance switching arrangement.

A second embodiment of the impedance switching arrangement 27 is identified in FIG. 3 with the number 27*b*. The impedance switching arrangement 27*b* has an impedance 36 in the form of an absorber resistor, to which a switching element 38 is connected in series. The switching element 38 is actuated by the controller 34.

When the switching element 38 is actuated by the controller 34 in a first actuation mode so that the switching element 38 is opened, the connection of the isolation terminal 26 to ground 39 is disconnected, with the result that no energy can be absorbed at the isolation terminal 26. When no laser or plasma is ignited yet in the discharge chamber 30, power is reflected at the discharge chamber 30. This power now cannot be absorbed in the impedance 36, so that power reflection also occurs at the combiner 22. A power peak thus results at the output 24, which results in the ignition of the laser or the plasma in the discharge chamber 30.

After a predetermined time or when the ignition of the laser or plasma is detected, the switching element 38 can be closed in a second actuation mode and the ignited laser or the ignited plasma can be supplied with power in normal operation. If an impedance change of the plasma and a mismatch connected thereto should occur due to the dynamics of the plasma, the power reflected at the discharge chamber 30 can be absorbed in the impedance 36.

Figure 4A:
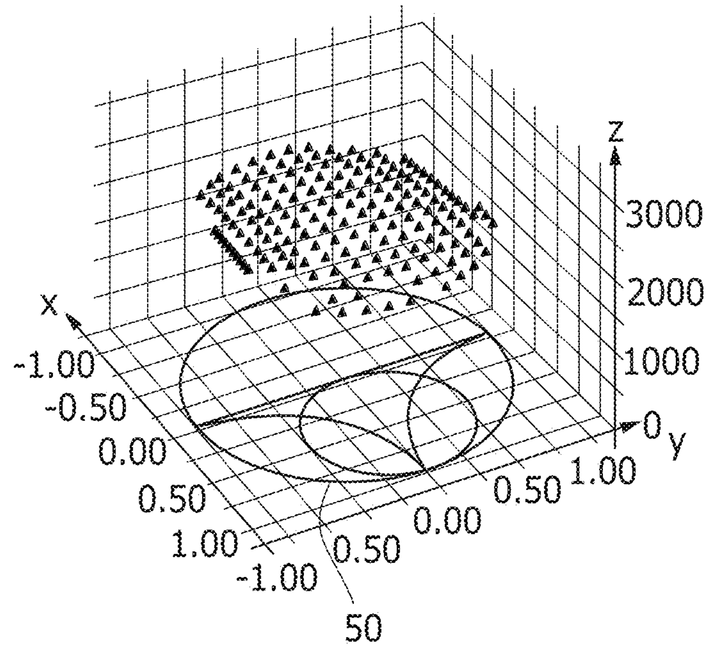
FIG. 4*a* shows the output characteristic of an amplifier over the load plane when the isolation terminal is terminated using an impedance.

FIG. 4*a* shows the load plane 50 in the form of a Smith chart. The real part of the reflection factor is plotted on the x-axis and the imaginary part of the reflection factor is plotted on the y-axis. The output power is indicated on the z-axis. It is evident here that the output power at the output terminal 24 is virtually constant for all reflection factors. The result therefore is a flat output power characteristic over the load plane 50. In particular, no power peaks are discernible. The figure shown was generated using a balanced amplifier, which has a 3 dB coupler as a combiner and in which neither was the impedance 36 in the form of an absorber resistor short-circuited nor was the connection of the isolation terminal 26 to ground 39 disconnected. A power peak which would be suitable for igniting a plasma or laser is not present for any load impedance.

Figure 4B:
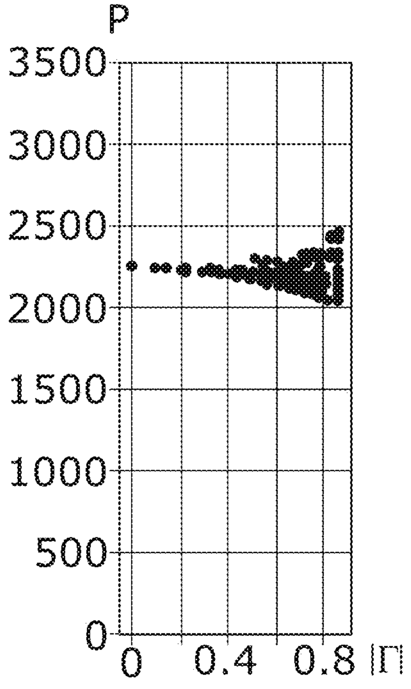
FIG. 4*b* shows a diagram of the power as a function of the absolute value of the reflection factor when the isolation terminal of the combiner of the amplifier is terminated using an impedance.

FIG. 4*b* shows a diagram corresponding to the situation of FIG. 4*a*, in which the output power supplied by the amplifier 12 is shown as a function of the absolute value of the reflection factor. It can be seen that the power is essentially constant and is not sufficient to ignite a plasma or a laser.

Figure 4C:
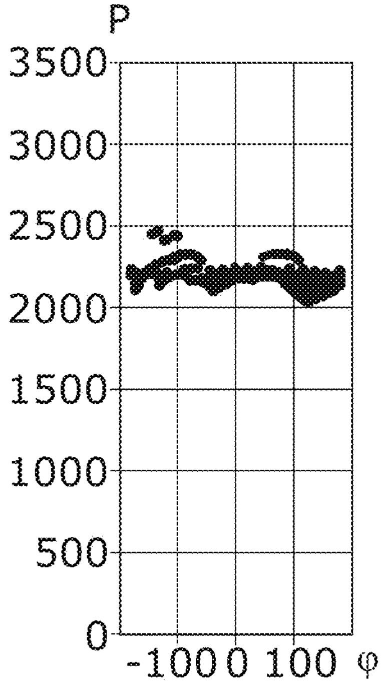
FIG. 4*c* shows a diagram of the power as a function of the angle of the reflection factor when the isolation terminal of the combiner of the amplifier is terminated using an impedance.

FIG. 4*c* shows a diagram corresponding to the situation of FIGS. 4*a*, 4*b*, in which the output power supplied by the amplifier 12 is shown as a function of the phase angle (p of the reflection factor.

Figure 5A:
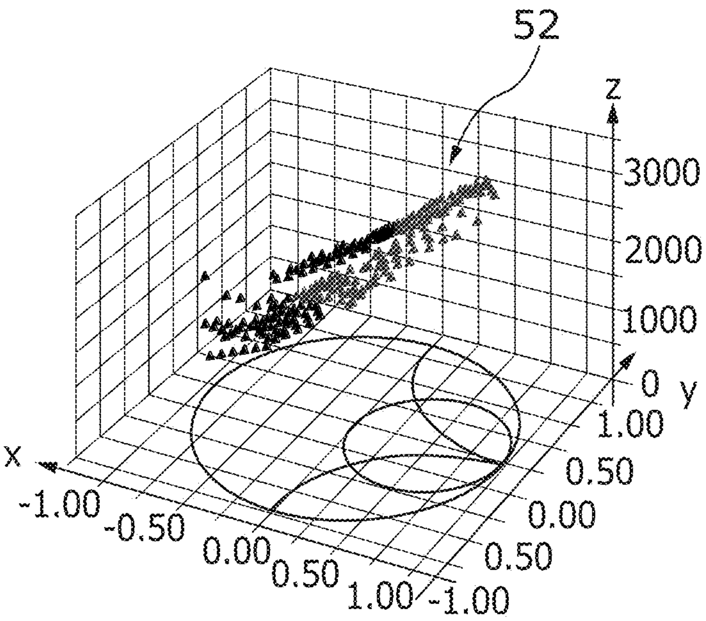
FIG. 5*a* shows the output characteristic of an amplifier over the load plane when the impedance at the isolation terminal of the combiner of the amplifier is short-circuited.
Figure 5B:
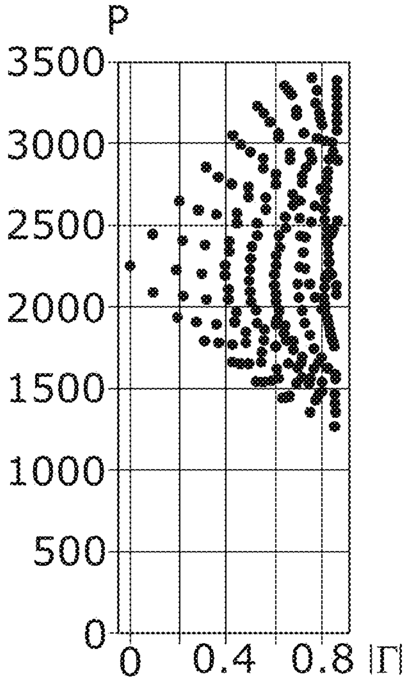
FIG. 5*b* shows a diagram of the power as a function of the absolute value of the reflection factor when the impedance at the isolation terminal of the combiner of the amplifier is short-circuited.
Figure 5C:
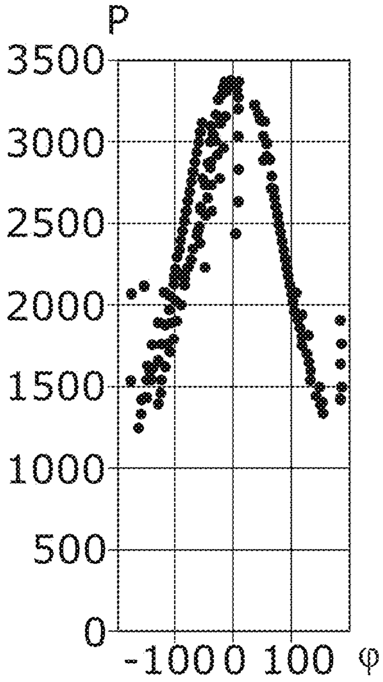
FIG. 5*c* shows a diagram of the power as a function of the angle of the reflection factor when the impedance at the isolation terminal of the combiner of the amplifier is short-circuited.

FIGS. 5*a*, 5*b*, 5*c* show diagrams corresponding to FIGS. 4*a*-4*c*, wherein here the switching element 38 of the impedance switching arrangement 27*a* was actuated according to a first actuation mode in order to short-circuit the impedance 36.

It is evident in FIG. 5*a* that a substantially flat power distribution was not attained, rather that power peaks occur in the region 52. It can be seen from associated FIG. 5*b* and FIG. 5*c* that at an absolute value of the reflection factor greater than 0.7 and an angle of the reflection factor of 0°, a significantly higher power results in comparison to the situation of FIGS. 4*a*-4*c*, which is capable of igniting a plasma or a laser.

Figure 6A:
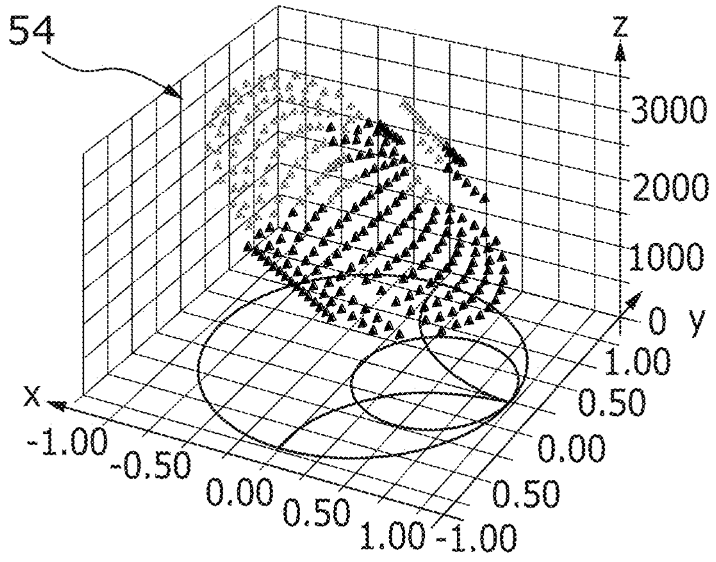
FIG. 6*a* shows the output characteristic of an amplifier over the load plane when the isolation terminal of the combiner of the amplifier is in idle mode.
Figure 6B:
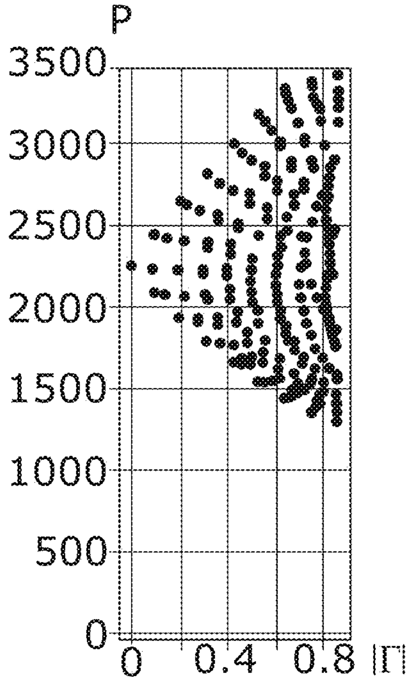
FIG. 6*b* shows a diagram of the power as a function of the absolute value of the reflection factor when the isolation terminal of the combiner of the amplifier is in idle mode.
Figure 6C:
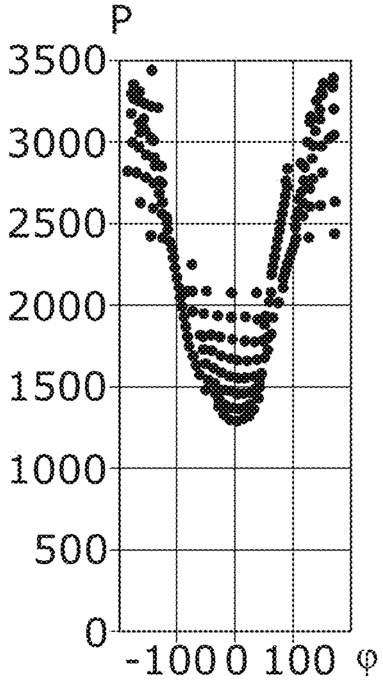
FIG. 6*c* shows a diagram of the power as a function of the angle of the reflection factor when the isolation terminal of the combiner of the amplifier is in idle mode.

FIGS. 6*a*, 6*b*, 6*c* show diagrams corresponding to FIGS. 4*a*-4*c*, wherein here the switching element 38 of the impedance switching arrangement 27*b* was actuated according to a first actuation mode to disconnect the connection of the isolation terminal 26 to ground 39.

It is evident in FIG. 6*a* that a substantially flat power distribution was not attained, rather that power peaks occur in the region 54. It can be seen from associated FIG. 6*b* and FIG. 6*c* that at an absolute value of the reflection factor greater than 0.7 and angles of the reflection factor of approximately +1800 and −180°, a significantly higher power results in comparison to the situation of FIGS. 4*a*-4*c*, which is capable of igniting a plasma or a laser.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article “a” or “the” in introducing an element should not be interpreted as being exclusive of a plurality of elements. Likewise, the recitation of “or” should be interpreted as being inclusive, such that the recitation of “A or B” is not exclusive of “A and B,” unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for igniting and supplying a laser or a processing plasma in a discharge chamber with electrical power, the method comprising:

providing a power from an output terminal of an amplifier to the discharge chamber, wherein the amplifier comprises at least two amplifier paths, each of the two amplifier paths supplies a respective signal to a combiner, wherein the combiner comprises the output terminal and an isolation terminal and is configured to combine the signals of the two amplifier paths as a function of an amplitude relationship and/or a phase relationship between the signals and to supply the power to the output terminal, actuating an impedance switching arrangement connected to the isolation terminal and a ground in a first actuation mode in order to ignite the laser or the processing plasma, and actuating the impedance switching arrangement in a second actuation mode in order to operate the laser or maintain the processing plasma in the discharge chamber, wherein the switching arrangement comprises an impedance and a switch connected to each other in parallel or in series, wherein when the switch and the impedance are connected to each other in parallel, the impedance and the switch are directly connected to the isolation terminal, and wherein when the switch and the impedance are connected to each other in series, one of the impedance and the switch is directly connected to the isolation terminal.

2. The method as claimed in claim 1, wherein the actuating the impedance switching arrangement in the first actuation mode is performed so that an impedance between the isolation terminal and the ground is approximately zero ohm or is approximately infinite.

3. The method as claimed in claim 1, wherein, to ignite the laser or the processing plasma, the impedance switching arrangement is actuated in the first actuation mode for a predetermined time in a range of 0.1 μs to 10 000 μs.

4. The method as claimed in claim 1, wherein, to ignite the laser or the processing plasma, the impedance switching arrangement is actuated in the first actuation mode until an ignition of the laser or the processing plasma is detected.

5. The method as claimed in claim 1, wherein the combiner comprises a 3 dB coupler.

6. The method as claimed in claim 1, wherein the combiner comprises a 90° hybrid coupler.

7. An amplifier connectable to a discharge chamber, the amplifier comprising:

a combiner having an output terminal, an isolation terminal, and two input terminals, wherein the combiner is configured to supply two signals at the two input terminals, respectively, and to supply a first power to the output terminal and/or a second power to the isolation terminal as a function of an amplitude relationship and/or a phase relationship between the two signals, at least two amplifier paths, wherein each of the at least two amplifier paths is configured to supply a respective signal of the two signals to a respective input terminal of the two input terminals of the combiner, an impedance switching arrangement connected between the isolation terminal and a ground, wherein the impedance switching arrangement comprises an impedance and a switch connected to each other in parallel or in series, wherein when the switch and the impedance are connected to each other in parallel, the impedance and the switch are directly connected to the isolation terminal, and wherein when the switch and the impedance are connected to each other in series, one of the impedance and the switch is directly connected to the isolation terminal, and a controller configured to actuate the impedance switching arrangement in a first actuation mode to ignite a laser or a processing plasma in the discharge chamber.

8. A plasma system comprising:

a discharge chamber, an amplifier connected to the discharge chamber and comprising a combiner and at least two amplifier paths, wherein each of the two amplifier paths supplies a respective signal to the combiner, wherein the combiner has an output terminal and an isolation terminal, and is configured to combine the signals of the two amplifier paths as a function of an amplitude relationship and/or a phase relationship between the signals and to supply a first power to the output terminal and/or a second power to the isolation terminal, an impedance switching arrangement connected between the isolation terminal and the ground, wherein the impedance switching arrangement comprises an impedance and a switch connected to each other in parallel or in series, wherein when the switch and the impedance are connected to each other in parallel, the impedance and the switch are directly connected to the isolation terminal, and wherein when the switch and the impedance are connected to each other in series, one of the impedance and the switch is directly connected to the isolation terminal, and a controller configured to actuate the impedance switching arrangement in a first actuation mode to ignite a processing plasma in the discharge chamber.

9. The plasma system as claimed in claim 8, further comprising an impedance matching device arranged between the discharge chamber and the amplifier, wherein the impedance matching device is connected to the output terminal via a line having an electrical length that is selected based on a wavelength and a dielectric material and magnetic properties of a connection.

10. The plasma system as claimed in claim 8, wherein the combiner comprises a 3 dB coupler.

11. The plasma system as claimed in claim 8, wherein the combiner comprises a 90° hybrid coupler.

* * * * *